United States Patent
Yoon et al.

(10) Patent No.: US 12,107,576 B2
(45) Date of Patent: Oct. 1, 2024

(54) ELECTROMECHANICAL LOGIC-IN-MEMORY DEVICE

(71) Applicant: SAMSUNG ELECTRONICS CO., LTD., Suwon-si (KR)

(72) Inventors: Junbo Yoon, Daejeon (KR); Yongbok Lee, Daejeon (KR); Suhyun Kim, Incheon (KR); Taesoo Kim, Jeollanam-do (KR); Pankyu Choi, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 3 days.

(21) Appl. No.: 17/965,098

(22) Filed: Oct. 13, 2022

(65) Prior Publication Data

US 2023/0268924 A1     Aug. 24, 2023

(30) Foreign Application Priority Data

Feb. 24, 2022   (KR) ........................ 10-2022-0024397

(51) Int. Cl.
*H03K 19/003*    (2006.01)
*H03K 19/21*    (2006.01)

(52) U.S. Cl.
CPC .......... *H03K 19/003* (2013.01); *H03K 19/21* (2013.01)

(58) Field of Classification Search
CPC .. H01H 1/0094; H01H 59/0009; H03K 19/20; H03K 19/02; H03K 19/21
See application file for complete search history.

(56) References Cited

U.S. PATENT DOCUMENTS

| 5,706,466 A | 1/1998 | Dockser |
| 7,355,258 B2 | 4/2008 | Valenzuela et al. |

(Continued)

FOREIGN PATENT DOCUMENTS

| CN | 101562049 B | 10/2009 |
| CN | 101803191 B | 8/2010 |

(Continued)

OTHER PUBLICATIONS

Ibe et al., IEEE Transactions on Electron Devices, vol. 57 (7), Jul. 2010.

(Continued)

*Primary Examiner* — Seokjin Kim
(74) *Attorney, Agent, or Firm* — Muir Patent Law, PLLC

(57) ABSTRACT

An electromechanical logic-in-memory device includes a switching unit including a first electrode having a conductive beam and second and third electrodes disposed on both sides of the conductive beam and attracting the conductive beam by electrostatic force, based on an operating voltage applied between the second and third electrodes and the conductive beam, the conductive beam, after being attracted by and adhered to the second or third electrode, maintained to be adhered even when the electrostatic force is removed and a controller determining an operation mode according to types of logic operations included in input data, setting an initial position of the conductive beam by applying the operating voltage to any one of the second and third electrodes, selecting at least one of the first to third electrodes, and applying a predetermined voltage as a true value of a logic value included in the input data.

20 Claims, 10 Drawing Sheets

(56) References Cited

U.S. PATENT DOCUMENTS

| | | |
|---|---|---|
| 7,612,270 B1 | 11/2009 | Zhu |
| 7,719,318 B1 | 5/2010 | Nordquist et al. |
| 8,203,880 B2 | 6/2012 | Schepens et al. |
| 8,436,637 B1 | 5/2013 | Ditto et al. |
| 8,982,528 B2 | 3/2015 | Fanet |
| 9,257,981 B2 | 2/2016 | Fanet et al. |
| 9,276,578 B2 | 3/2016 | Despont et al. |
| 10,536,150 B1 | 1/2020 | Granger-Jones et al. |
| 11,031,937 B2 | 6/2021 | Nanaiah et al. |
| 2012/0168290 A1* | 7/2012 | Fujita ............... H01H 59/0009 200/181 |
| 2013/0306937 A1* | 11/2013 | Cao ..................... B82Y 10/00 257/29 |
| 2014/0318937 A1* | 10/2014 | Lewis ................. H01H 45/14 200/181 |
| 2021/0111723 A1* | 4/2021 | Nanaiah ............... H03K 19/21 |
| 2021/0242858 A1 | 8/2021 | Tella et al. |

FOREIGN PATENT DOCUMENTS

| | | |
|---|---|---|
| JP | 2015-213994 A | 12/2015 |
| WO | 2003/085313 A2 | 10/2003 |

OTHER PUBLICATIONS

Letters Patent issued on Jul. 21, 2024 by the Taiwan Intellectual Property Office for the corresponding Taiwanese patent application TW 111144929.

* cited by examiner

| $V_1 \left( = -\frac{V_{ov}}{2} \right)$ | $V_3 \left( = \frac{V_{ov}}{2} \right)$ | STATE |
|---|---|---|
| 0 | 0 | 0 |
| 0 | 1 | 0 |
| 1 | 0 | 0 |
| 1 | 1 | 0 → 1 |

| $V_1 \left( = -\frac{V_{OV}}{2} \right)$ | $V_2 \left( = \frac{V_{OV}}{2} \right)$ | STATE |
|---|---|---|
| 0 | 0 | 1 |
| 0 | 1 | 1 |
| 1 | 0 | 1 |
| 1 | 1 | 1 → 0 |

| $V_a \; (\geqq V_{ov})$ | 상태 |
|---|---|
| 0 | 1 |
| 1 | 1 → 0 |

| $V_1 (\geqq V_{ov})$ | $V_3 (\geqq V_{ov})$ | STATE |
|---|---|---|
| 0 | 0 | 0 |
| 0 | 1 | 0 → 1 |
| 1 | 0 | 0 → 1 |
| 1 | 1 | 0 |

| $V_1 (\geqq V_{ov})$ | $V_2 (\geqq V_{ov})$ | STATE |
|---|---|---|
| 0 | 0 | 1 |
| 0 | 1 | 1 → 0 |
| 1 | 0 | 1 → 0 |
| 1 | 1 | 1 |

ELECTROMECHANICAL LOGIC-IN-MEMORY DEVICE

CROSS-REFERENCE TO RELATED APPLICATION

This application claims the benefit of priority to Korean Patent Application No. 10-2022-0024397 filed on Feb. 24, 2022, in the Korean Intellectual Property Office, the disclosure of which is incorporated herein by reference in its entirety.

BACKGROUND

1 Field

Embodiments relate to an electromechanical logic-in-memory device.

2 Description of the Related Art

Recently, as the field of application of a computing system has been expanded to new fields such as autonomous driving, the amount of data to be processed thereby has increased exponentially and a possibility that a large-scale accident may occur due to a single data operation error has increased.

SUMMARY

An embodiment is directed to an electromechanical logic-in-memory device includes: a switching unit including a first electrode having a conductive beam and second and third electrodes disposed on both sides of the conductive beam and attracting the conductive beam by electrostatic force, based on an operating voltage applied between the second and third electrodes and the conductive beam, the conductive beam, after being attracted by and adhered to the second or third electrode, maintained to be adhered even when the electrostatic force is removed, and a controller determining an operation mode according to types of logic operations included in input data, setting an initial position of the conductive beam by applying the operating voltage to any one of the second and third electrodes according to the determined operation mode, selecting at least one of the first to third electrodes according to the determined operation mode, and applying a predetermined voltage as a true value of a logic value included in the input data.

An embodiment is directed to an electromechanical logic-in-memory device includes: a first electrode having a conductive beam, second and third electrodes disposed on both sides of the conductive beam and causing the conductive beam to be bent by electrostatic force, based on a potential difference between the second and third electrodes and the conductive beam, and a controller determining an operation mode according to types of logic operations included in input data, setting an initial position of the conductive beam by applying the potential difference to any one of the second and third electrodes according to the determined operation mode, selecting at least one of the first to third electrodes according to the determined operation mode, and applying a predetermined voltage as a true value of a logic value included in the input data, wherein, after the conductive beam is adhered to the second or third electrode, the conductive beam is maintained to be adhered even when the electrostatic force is removed.

An embodiment is directed to an electromechanical logic-in-memory device includes: a first electrode including a connection portion and a conductive beam extending from the connection portion, second and third electrodes disposed on both sides of the conductive beam and causing the conductive beam to be bent by electrostatic force, based on a potential difference between the second and third electrodes and the conductive beam, and a controller determining an operation mode according to types of logic operations included in input data, setting an initial position of the conductive beam by applying the potential difference to any one of the second and third electrodes according to the determined operation mode, selecting at least one of the first to third electrodes according to the determined operation mode, and applying a predetermined voltage as a true value of a logic value included in the input data, wherein the input data includes any one of an AND operation, a NAND operation, a NOT operation, an XOR operation, and an XNOR operation, and after the conductive beam is adhered to the second or third electrode, the conductive beam is maintained to be adhered even when the electrostatic force is removed.

BRIEF DESCRIPTION OF DRAWINGS

Features will become apparent to those of skill in the art by describing in detail example embodiments with reference to the attached drawings in which.

DETAILED DESCRIPTION

Figure 1:
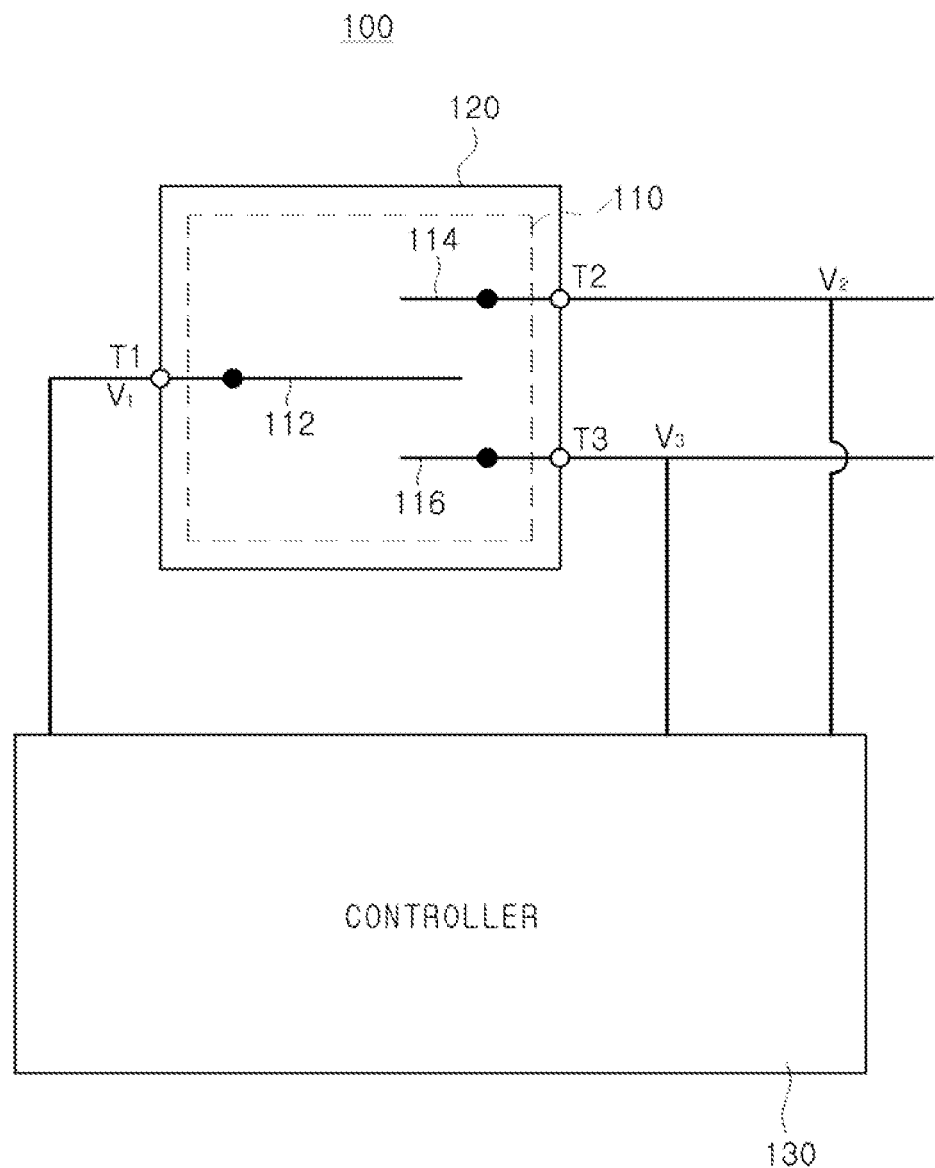
FIG. 1 is a schematic block diagram illustrating an electromechanical logic-in-memory device according to an example embodiment.
Figure 2A:
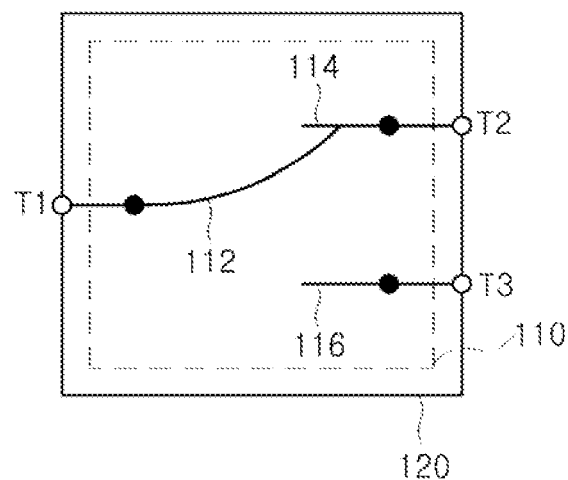
FIGS. 2A and 2B are views illustrating logic values of the electromechanical logic-in-memory device of FIG. 1.
Figure 2B:
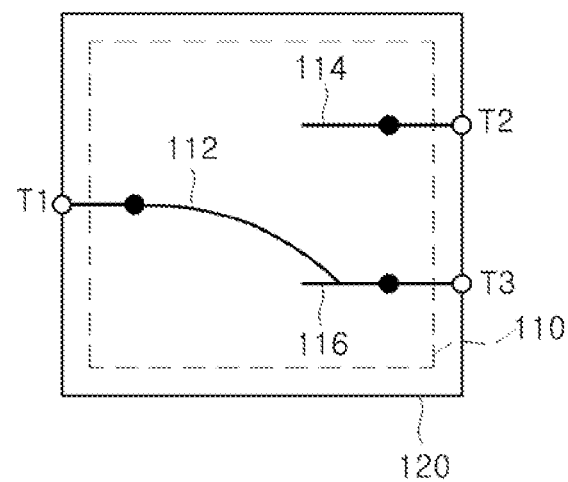
Figure 3:
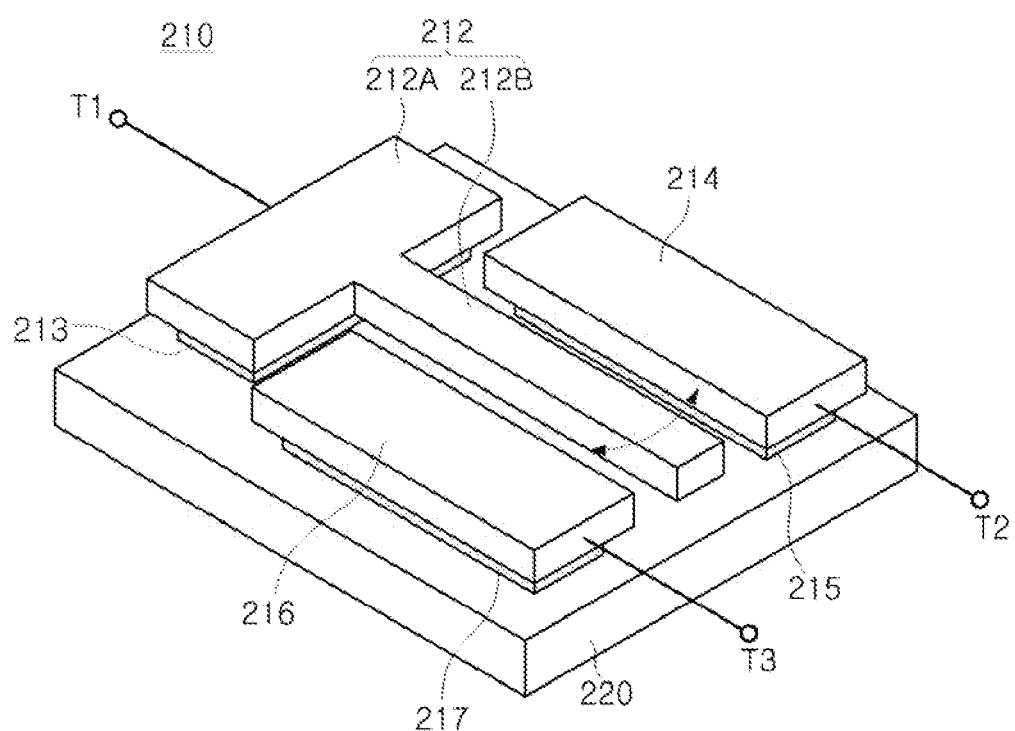
FIG. 3 is a perspective view of a switching unit of an electromechanical logic-in-memory device according to an example embodiment.

FIG. 1 is a schematic block diagram illustrating an electromechanical logic-in-memory device according to an example embodiment. FIGS. 2A and 2B are views illustrating logic values of the electromechanical logic-in-memory device of FIG. 1. FIG. 3 is a perspective view of a switching unit of an electromechanical logic-in-memory device according to an example embodiment.

Referring to FIG. 1, an electromechanical logic-in-memory device 100 according to an example embodiment may include a substrate 120, a switching unit 110, and a controller 130.

The switching unit 110 may be disposed on the substrate 120. The substrate 120 may include an integrated circuit manufactured by a complementary metal-oxide semiconductor (CMOS) process. For example, the substrate 120 may include a memory device, a light emitting device, a transistor, and a wiring.

The switching unit 110 may be driven by the controller 130 to perform a logic operation on logical values input through first to third terminals T1, T2, and T3, and store a logic operation data that is a result of the operation. That is, the switching unit 110 may operate as an arithmetic device calculating a logical value input from the controller 130 and a nonvolatile memory device storing the arithmetic result.

A first electrode 112 of the switching unit 110 may be configured to be adhered to second and third electrodes 114 and 116 by electrostatic force formed by a potential difference with second and third electrodes 114 and 116. That is, the first to third electrodes 112, 114, and 116 may form a conductive path by a voltage applied through the controller 130. To this end, the first electrode 112 may include a conductive beam having bending characteristics due to an occurrence of a pull-in phenomenon when electrostatic force formed by a potential difference greater than or equal to a predetermined level (hereinafter, referred to as 'operating voltage ($V_{OV}$)') is applied to the first electrode 112. The first to third electrodes 112, 114, and 116 may be formed of the same conductive material. In another implementation, the first electrode 112 may be formed of a conductive material different from that of the second and third electrodes 114 and 116.

Referring to FIG. 3, a switching unit employable in the electromechanical logic-in-memory device according to an example embodiment will now be described.

The present example embodiment is a case in which a lateral electrostatic driving memory in which a conductive beam is bent in a horizontal direction is employed in the switching unit. However, other types of electrostatic driving memories may be employed.

The switching unit 210 according to an example embodiment may include a substrate 220, first to third insulating layers 213, 215, and 217, and first to third electrodes 212, 214, and 216. As described above, the substrate 220 may include an integrated circuit manufactured by a CMOS process. The first to third electrodes 212, 214, and 216 may be supported by the first to third insulating layers 213, 215, and 217, respectively, and disposed on the substrate 220. The first to third electrodes 212, 214, and 216 may be connected to the controller 130 through the first to third terminals T1, T2, and T3 of FIG. 1.

The first electrode 212 may include a connection portion 212A and a conductive beam 212B. The conductive beam 212B may be supported on the substrate 220 through the connection portion 212A to be spaced apart, e.g., by the first insulating layer 213, from the substrate 220 by a predetermined interval, and may be locally connected to the substrate 220.

The conductive beam 212B may be disposed to be spaced apart from the second or third electrode 214 or 216 by a predetermined interval. The conductive beam 212B may be spaced apart from each of the second or third electrode 214 or 216 by substantially the same interval. The conductive beam 212B may be electrostatically driven by electrostatic force when a potential difference greater than or equal to the operating voltage $V_{OV}$ is applied between the conductive beam 212B and the second or third electrode 214 or 216, so as to be bent in a horizontal direction, and then adhered to the second or third electrode 214 or 216. That is, the conductive beam 212B may be attracted by the second or third electrodes 214, 216 to be adhered to the second or third electrode 214 or 216. The conductive beam 212B may have an appropriate length, width, and thickness so that an adhesive force generated by being adhered to the second or third electrode 214 or 216 is greater than a restoring force for returning a bent state of the conductive beam 212B. As a result, even if the electrostatic force generated by the second or third electrode 214 or 216 is removed, the conductive beam 212B may maintain a state of being adhered to the second or third electrode 214 or 216. Accordingly, the switching unit 210 may have a characteristic of a nonvolatile memory in which a logic operation result is stored. The conductive beam 212B may be formed of a conductive material that is flexible and resistant to fatigue. For example, the conductive beam 212B may be formed of a conductive material such as metal, carbon nanotubes, graphene, or a conductive polymer. In an implementation, the conductive beam 212B may be formed of a material having high conductivity used in a general electrode.

A logic value of a switching unit employed in the electromechanical logic-in-memory device of FIG. 1 will be described with reference to FIGS. 2A and 2B.

Referring to FIG. 2A, when a potential difference corresponding to the operating voltage $V_{OV}$ is applied between the first electrode 112 and the second electrode 114, the first electrode 112 may be adhered to the second electrode 114 by electrostatic force, and even if the potential difference disappears, the adhesive state may be maintained by the adhesive force between the first electrode 112 and the second electrode 114. Hereinafter, a case in which the first electrode 112 and the second electrode 114 are adhered is defined as a logical value '0' and described. In addition, referring to FIG. 2B, when the potential difference corresponding to the operating voltage $V_{OV}$ is applied between the first electrode 112 and the third electrode 116, the first electrode 112 may be adhered to the third electrode 116 to maintain the adhesive state. Hereinafter, a case in which the first electrode 112 and the third electrode 116 are adhered is defined as a logical value '1' and described.

The controller 130 may identify a type of a logic operation included in input data input from the outside, and control the switching unit 110 to perform the identified logic operation. For example, the controller 130 may identify which of an AND operation, a NAND operation, a NOT operation, an XOR operation, and an XNOR is the logic operation included in the input data. The controller 130 may determine an operation mode in which the switching unit 110 operates in order to perform the identified a logic operation. That is, the controller 130 may select one of an AND operation mode, a NAND operation mode, a NOT operation mode, an XOR operation mode, and an XNOR operation mode according to the type of a logic operation included in the input data.

The controller 130 may set initial states of the first to third electrodes 112, 114, and 116 according to the selected operation mode, select a terminal (hereinafter, an 'input terminal') to which a logic value included in the input data is to be input, among the first to third terminals T1, T2, and T3, and apply a predetermined voltage corresponding to the logic value to the input terminal as a true value of the logic value. In this regard, a description will be given with reference to FIGS. 4A to 8B.

When the input data includes an AND operation, the controller 130 may control the switching unit 110 to operate in an AND gate mode. An operation process of the switching unit 110 will now be described with reference to FIGS. 4A and 4B.

Figures 4A, 4B:
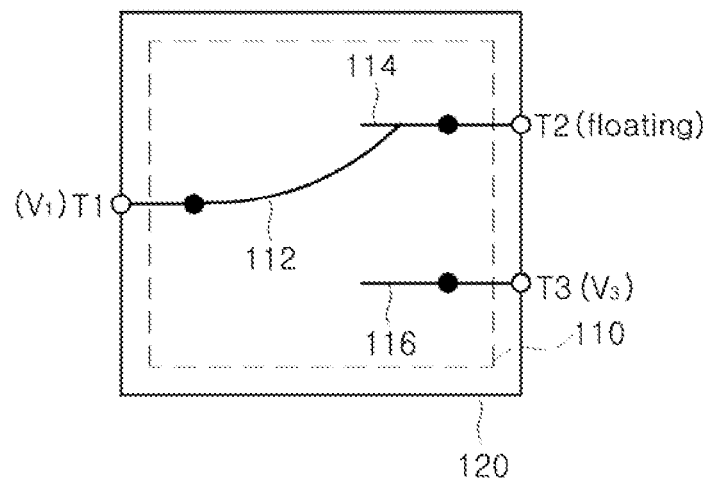
FIG. 4A is a view illustrating an initial state when an electromechanical logic-in-memory device operates in an AND gate mode.
FIG. 4B is a view illustrating logic values respectively input to input terminals when an electromechanical logic-in-memory device operates in an AND gate mode and calculation results.

FIG. 4A is a view illustrating an initial state when an electromechanical logic-in-memory device operates as an AND gate, and FIG. 4B is a view illustrating logic values respectively input to input terminals when an electromechanical logic-in-memory device operates in an AND gate mode and calculation results.

In the AND gate mode, the switching unit 110 may be in an initial state of a logic value '0'. Referring to FIG. 4A, the controller 130 may set to the initial state of the logic value '0' by applying the operating voltage $V_{OV}$ between the first terminal T1 and the second terminal T2 so that the first electrode 112 is adhered to the second electrode 114.

In the AND gate mode, the first terminal T1 and the third terminal T3 of the switching unit 110 may be selected as input terminals, and a logic value, e.g., a first logic value and a second logic value, may be respectively input to each of the selected input terminals.

Referring to FIG. 4B, the controller 130 may select the first terminal T1 and the third terminal T3 as input terminals, and input a predetermined voltage as a true value of the logical value to the first terminal T1 and the third terminal T3. In this case, the predetermined voltage corresponding to the true value of the logic value may be determined within a range in which a potential difference between the first terminal T1 and the third terminal T3 is an operating voltage. For example, when the logic value is '1', a voltage $V_1$ of $-\frac{1}{2}$ times the operating voltage $V_{OV}$ may be applied to the first terminal T1, and a voltage V3 of ½ times the operating voltage $V_{OV}$ may be applied to the third terminal T3. Accordingly, only when the logic value '1' is input to each of the first terminal T1 and the third terminal T3, the potential difference of the operating voltage is generated between the first terminal T1 and the third terminal T3 to change to a state of the logic value '1' in which the first electrode 112 is adhered to the third electrode 116. That is, the switching unit 110 operates as an AND gate outputting the logic value '1' only when the logic value '1' is input to both the first terminal T1 and the third terminal T3. The logic operation result is maintained by the adhesive force between the conductive beam of the first terminal T1 and the third electrode 116 even when the predetermined voltage applied to the first terminal T1 and the third terminal T3 is removed. That is, the switching unit 110 may maintain a state in which the logic operation result is stored. The second terminal T2 that is not selected as the input terminal, i.e., corresponding to an unselected electrode, may be maintained in a floating state rather than a state of a logic value '0' or '1'.

When the input data includes a NAND operation, the controller 130 may control the switching unit 110 to operate in a NAND gate mode. An operation process of the switching unit 110 will now be described with reference to FIGS. 5A and 5B.

Figures 5A, 5B:
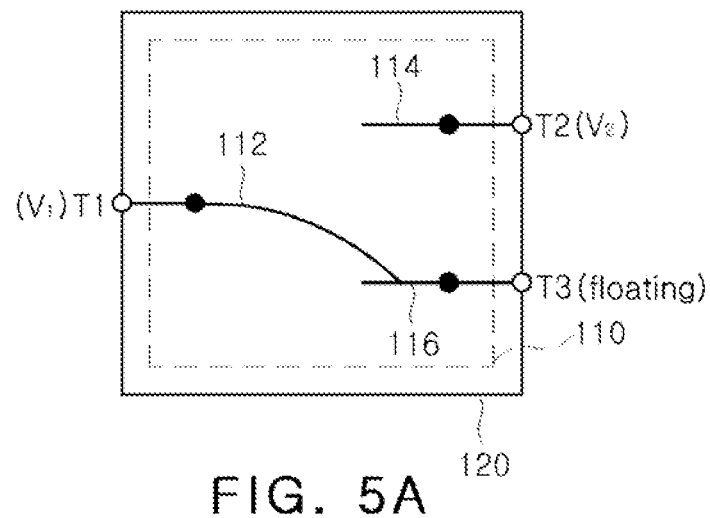
FIG. 5A is a view illustrating an initial state when an electromechanical logic-in-memory device operates in a NAND gate mode.
FIG. 5B is a view illustrating logic values respectively input to input terminals when an electromechanical logic-in-memory device operates in a NAND gate mode and calculation results.

FIG. 5A is a view illustrating an initial state when the electromechanical logic-in-memory device operates in the NAND gate mode, and FIG. 5B is a view illustrating logic values respectively input to input terminals when an electromechanical logic-in-memory device operates in a NAND gate mode and calculation results.

In the NAND gate mode, the switching unit 110 may be in an initial state of a logic value '1'. Referring to FIG. 5A, the controller 130 may set to an initial state of the logic value '1' by applying the operating voltage $V_{OV}$ between the first terminal T1 and the third terminal T3 so that the first electrode 112 is adhered to the third electrode 116.

In the NAND gate mode, the first terminal T1 and the second terminal T2 of the switching unit 110 may be selected as input terminals, and a logic value may be input to each of the selected input terminals.

Referring to FIG. 5B, the controller 130 may select the first terminal T1 and the second terminal T2 as input terminals, and input a predetermined voltage as a true value of the logic value to the first terminal T1 and the second terminal T2. The predetermined voltage corresponding to a true value of the logic value may be determined within a range in which the potential difference between the first terminal T1 and the second terminal T2 is the operating voltage. For example, when the logic value is '1', a voltage $V_1$ of $-\frac{1}{2}$ times the operating voltage $V_{OV}$ may be applied to the first terminal T1, and a voltage V2 of ½ times the operating voltage $V_{OV}$ may be applied to the second terminal T2. Therefore, only when the logic value '1' is input to each of the first terminal T1 and the second terminal T2, a potential difference of the operating voltage is generated between the first terminal T1 and the third terminal T3 to change to a logic value '1' in which the first electrode 112 is adhered to the third electrode 116. That is, it can be seen that the switching unit 110 operates as a NAND gate outputting the logic value '0' only when the logic value '1' is input to both the first terminal T1 and the second terminal T2. The third terminal T3 that is not selected as an input terminal may be maintained in a floating state rather than a state of the logic value '0' or '1'.

When the input data includes a NOT operation, the controller 130 may control the switching unit 110 to operate in a NOT gate mode. An operation process of the switching unit 110 will now be described with reference to FIGS. 6A and 6B.

Figures 6A, 6B:
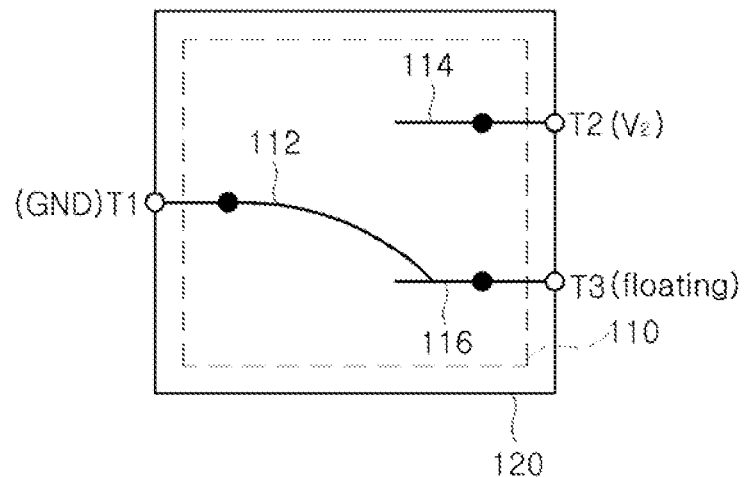
FIG. 6A is a view illustrating an initial state when an electromechanical logic-in-memory device operates in a NOT gate mode.
FIG. 6B is a view illustrating logic values respectively input to input terminals when an electromechanical logic-in-memory device operates in a NOT gate mode and calculation results.

FIG. 6A is a view illustrating an initial state when the electromechanical logic-in-memory device operates in the NOT gate mode, and FIG. 6B is a view illustrating logic values respectively input to input terminals when an electromechanical logic-in-memory device operates in a NOT gate mode and calculation results.

In the NOT gate mode, the switching unit 110 may be in an initial state of the logic value '1'. Referring to FIG. 6A, the controller 130 may set to the initial state of the logic value '1' by applying the operating voltage $V_{OV}$ between the first terminal T1 and the third terminal T3 so that the first electrode is adhered to the third electrode 116.

In the NOT gate mode, the second terminal T2 of the switching unit 110 may be selected as an input terminal, and a logic value may be input to the selected input terminal.

Referring to FIG. 6B, the controller 130 may select the second terminal T2 as an input terminal and input a predetermined voltage $V_2$ as a true value of the logic value to the second terminal T2. In this case, the predetermined voltage $V_2$ corresponding to the true value of the logic value may be a voltage equal to or greater than the operating voltage $V_{OV}$. Accordingly, when the logic value '0' is input to the second terminal T2, the initial state may be maintained to output the logic value '1', and when the logic value '1' is input to the second terminal T2, a potential difference greater than or equal to the operating voltage may be generated between the first electrode 112 and the second electrode 114, to change to a state of the logic value '0' in which the first electrode 112 is adhered to the second electrode 114. That is, it can be seen that the switching unit 110 operates as a NOT gate outputting a logic value opposite to the logic value input to the second terminal T2. The first terminal T1 that is not selected as an input terminal may be connected to a ground electrode, and the third terminal T3 may be maintained in a floating state rather than a state of a logic value '0' or '1'.

When the input data includes an XOR operation, the controller 130 may control the switching unit 110 to operate in the XOR gate mode. An operation process of the switching unit 110 will now be described with reference to FIGS. 7A and 7B.

Figures 7A, 7B:
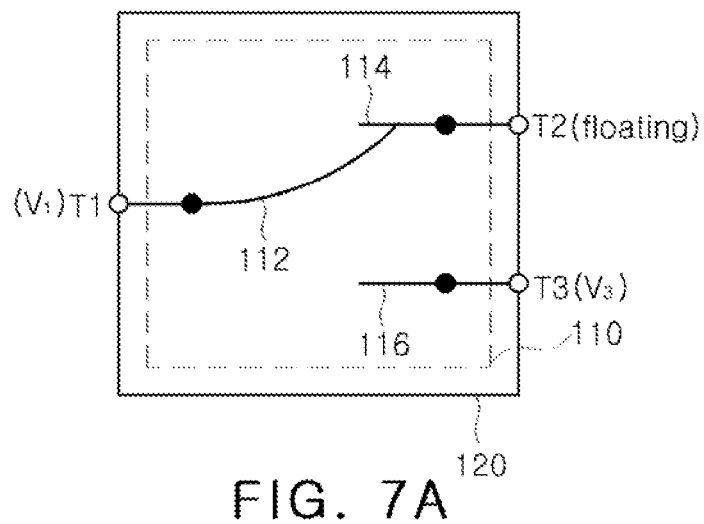
FIG. 7A is a view illustrating an initial state when an electromechanical logic-in-memory device operates in an XOR gate mode.
FIG. 7B is a view illustrating logic values respectively input to input terminals when an electromechanical logic-in-memory device operates in an XOR gate mode and calculation results.

FIG. 7A is a view illustrating an initial state when the electromechanical logic-in-memory device operates in the XOR gate mode, and FIG. 7B is a view illustrating logic values respectively input to input terminals when an electromechanical logic-in-memory device operates in an XOR gate mode and calculation results.

In the XOR gate mode, the switching unit 110 may be in an initial state of a logic value '0'. Referring to FIG. 7A, the controller 130 may set to the initial state of the logic value '0' by applying the operating voltage $V_{OV}$ between the first terminal T1 and the second terminal T2 so that the first electrode 112 is adhered to the second electrode 114.

In the XOR gate mode, the first terminal T1 and the third terminal T3 of the switching unit 110 may be selected as input terminals, and logic values may be input to the selected input terminals, respectively.

Referring to FIG. 7B, the controller 130 may select the first terminal T1 and the third terminal T3 as input terminals, and input predetermined voltages $V_1$ and $V_3$ as true values of logic values to the first terminal T1 and the third terminal T3. In this case, the predetermined voltages $V_1$ and $V_3$ corresponding to the true values of logic values may be determined within a range in which the potential difference between the first terminal T1 and the third terminal T3 is equal to or greater than the operating voltage $V_{OV}$. Accordingly, only when different logic values are input to the first terminal T1 and the third terminal T3, respectively, the potential difference of the operating voltage $V_{OV}$ between the first terminal T1 and the third terminal T3 is generated to change to the state of logic value '1' in which the first electrode 112 is adhered to the third electrode 116. That is, it can be seen that the switching unit 110 operates as an XOR gate outputting the logic value '1' only when different logic values are input to the first terminal T1 and the third terminal T3. The second terminal T2 that is not selected as an input terminal may be maintained in a floating state rather than a state of the logic value '0' or '1'.

When the input data includes an XNOR operation, the controller 130 may control the switching unit 110 to operate in the XNOR gate mode. An operation process of the switching unit 110 will now be described with reference to FIGS. 8A and 8B.

Figures 8A, 8B:
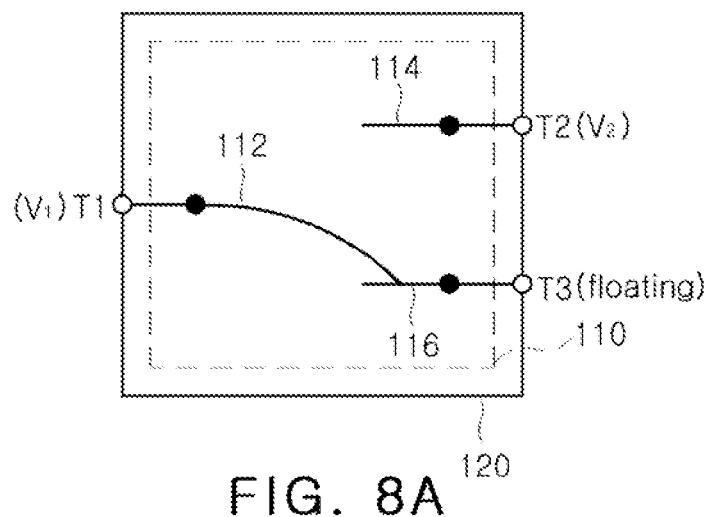
FIG. 8A is a view illustrating an initial state when an electromechanical logic-in-memory device operates in an XNOR gate mode.
FIG. 8B is a view illustrating logic values respectively input to input terminals when an electromechanical logic-in-memory device operates in an XNOR gate mode and calculation results.

FIG. 8A is a view illustrating an initial state when the electromechanical logic-in-memory device operates in the XNOR gate mode, and FIG. 8B is a view illustrating logic values respectively input to input terminals when an electromechanical logic-in-memory device operates in the XNOR gate mode and calculation results.

In the XNOR gate mode, the switching unit 110 may be in an initial state of the logic value '1'. Referring to FIG. 8A, the controller 130 may set to the initial state of the logic value '0' by applying the operating voltage $V_{OV}$ between the first terminal T1 and the third terminal T3 so that the first electrode 112 is adhered to the third electrode 116.

In the XNOR gate mode, the first terminal T1 and the second terminal T2 of the switching unit 110 may be selected as input terminals, and logic values may be respectively input to the selected input terminals.

Referring to FIG. 8B, the controller 130 may select the first terminal T1 and the second terminal T2 as input terminals and apply predetermined voltages $V_1$ and $V_2$ as true values of logic values, respectively. In this case, the predetermined voltages $V_1$ and $V_2$ corresponding to the true values of logic values may be determined within a range in which a potential difference between the first terminal T1 and the second terminal T2 is equal to or greater than the operating voltage $V_{OV}$. Therefore, only when different logic values are input to the first terminal T1 and the second terminal T2, respectively, a potential difference of the operating voltage $V_{OV}$ may be generated between the first terminal T1 and the third terminal T3 to change to a state of the logic value '0' in which the first electrode 112 is adhered to the second electrode 114. That is, it can be seen that the switching unit 110 operates as an XNOR gate outputting the logic value '0' only when different logic values are input to the first terminal T1 and the second terminal T2. The third terminal T3 that is not selected as an input terminal may be maintained in a floating state rather than the state of a logic value '0' or '1'.

Figure 9:
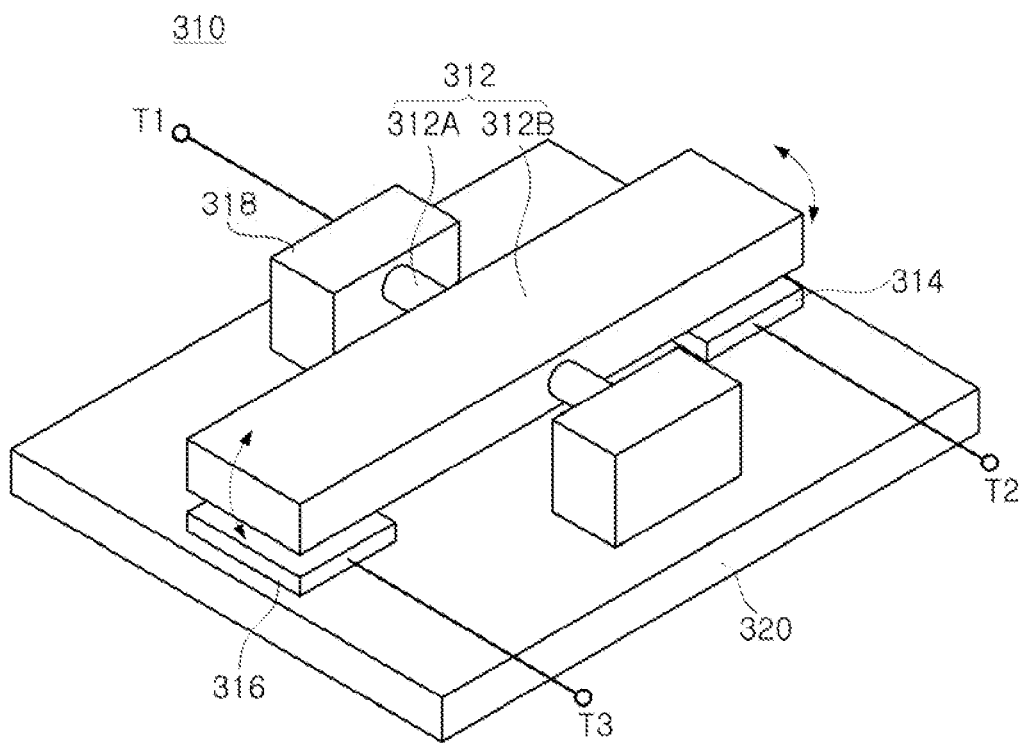
FIG. 9 is a perspective view of a switching unit of an electromechanical logic-in-memory device according to an example embodiment.

Referring to FIG. 9, a switching unit employable in an electromechanical logic-in-memory device according to an example embodiment will now be described.

FIG. 9 is a perspective view of a switching unit of an electromechanical logic-in-memory device according to an example embodiment.

According to an example embodiment, a vertical electrostatic driving memory in which both ends of a conductive beam move in a vertical direction with respect to a support axis is employed in a switching unit.

A switching unit 310 according to an example embodiment may include a substrate 320, first to third electrodes 312, 314, and 316, and a support portion 318. As described above, the substrate 320 may include an integrated circuit (IC) manufactured by a CMOS process. The first to third electrodes 312, 314, and 316 may be connected to the controller 130 through the first to third terminals T1, T2, and T3 of FIG. 1.

The first electrode 312 may include a connection portion 312A and a conductive beam 312B. The conductive beam 312B may be formed in a long rod shape, and the connection portions 312A may be disposed at the centers of both sides of the conductive beam 312B, respectively. The connection portion 312A may be fixed to a support portion 318 attached to the substrate 320 so that the conductive beam 312B is spaced apart from the substrate 320 at a predetermined interval.

The second and third electrodes 314 and 316 may be respectively disposed at lower portions of both ends of the conductive beam 312B to be spaced apart from each other by a predetermined interval. Both ends of the conductive beam 312B are moved by electrostatic force when a potential difference greater than or equal to the operating voltage $V_{OV}$ is generated between the second or third electrode 314 or 316 and may be adhered to the second or third electrode 314 or 316. The conductive beam 312B may be provided to have an appropriate length, width, and thickness so that adhesive force generated by being adhered to the second or third electrode 314 or 316 is greater than a restoring force of the connection portion 312A. As a result, even if an electrostatic force applied by the second or third electrode 314 or 316 is removed, the conductive beam 312B may maintain a state of being adhered to the second or third electrode 314 or 316. The other configuration is the same as that of the switching unit 210 of FIG. 3, and thus, a detailed description will be omitted to prevent repetition of the description.

Next, an operation of the electromechanical logic-in-memory device according to an example embodiment will be described with reference to FIG. 10. The operation of the electromechanical logic-in-memory device of FIG. 10 will be described with reference to the electromechanical logic-in-memory device 100 illustrated in FIG. 1 and the switching unit 210 illustrated in FIG. 3.

Figure 10:
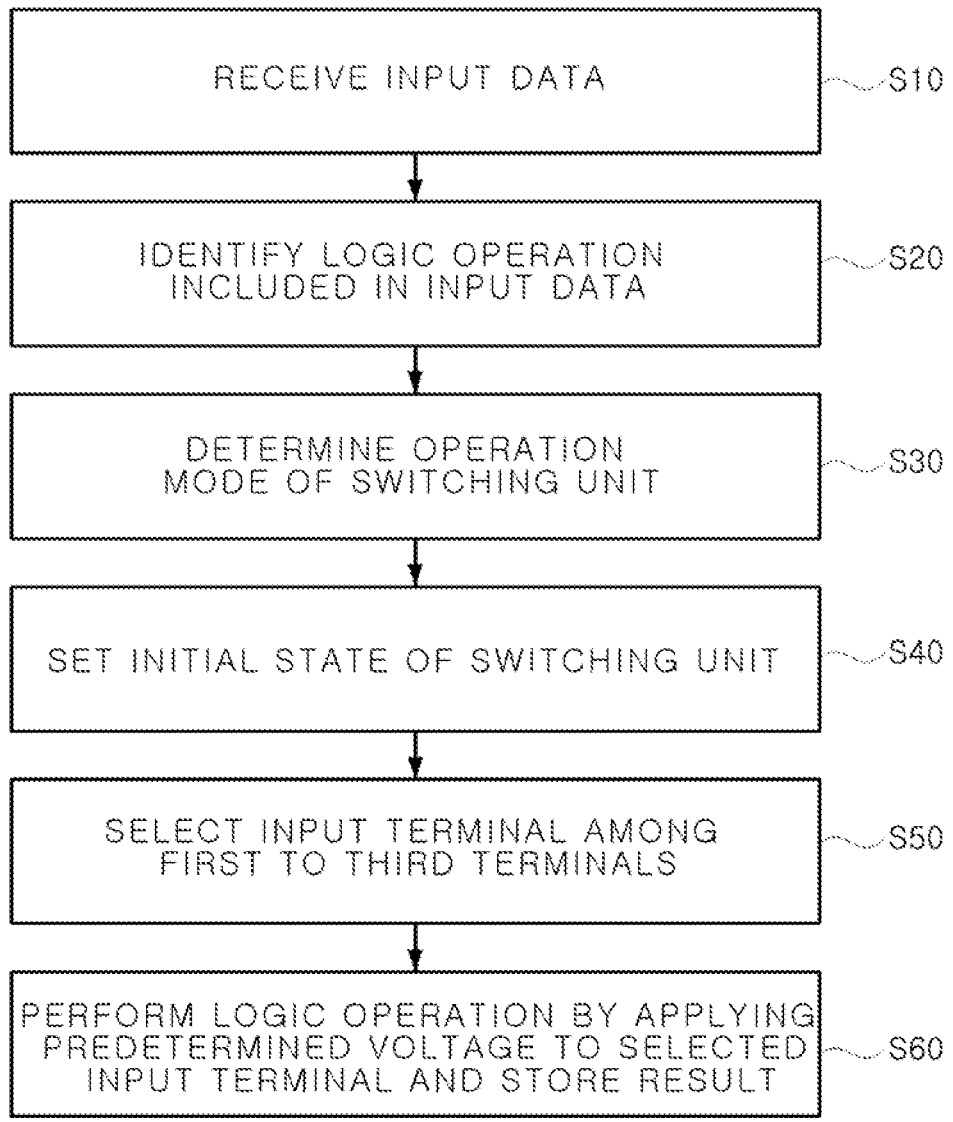
FIG. 10 is a flowchart illustrating an operation of an electromechanical logic-in-memory device.

Referring to FIG. 10, first, the controller 130 may receive input data (S10). The input data may include a logical value and a logic operation. The controller 130 may identify a type of the logic operation included in the input data (S20). The controller 130 may determine an operation mode of the switching unit 110 based on the identified type of logic operation (S30). The controller 130 may set an initial state of the switching unit 110 to correspond to the determined operation mode (S40). The controller 130 may select an input terminal to input a logic value from among the first to third terminals T1, T2, and T3 of the switching unit 110 (S50). The controller 130 may perform a logic operation by inputting a predetermined voltage to the selected input terminal, and store a result of the logic operation as a state in which the conductive beam 212B of the first electrode 112 is adhered to the second or third electrode 114 or 116.

By way of summation and review, research into a device that may perform an operation at ultra-high speed, while maintaining high stability, even in a harsh environment, has been conducted. In particular, research into an electromechanical switching device performing ultra-high-speed operations using a mechanically moving device rather than a semiconductor device has been actively conducted in recent years. The electromechanical switching device is referred to as a nanoelectromechanical system (NEMS) device or a microelectromechanical system (MEMS) device according to a size thereof. The electromechanical switching element may store a switching state through an operation in which a movable electrode is bent in a fixed electrode direction or restored to an original direction thereof according to a voltage applied to both ends of the electrode.

As described above, an example embodiment may provide an electromechanical logic-in-memory device capable of performing a logic operation and storage.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. An electromechanical logic-in-memory device, comprising:
    a switching unit including a first electrode having a conductive beam and second and third electrodes disposed on both sides of the conductive beam and attracting the conductive beam by electrostatic force, based on an operating voltage applied between the second and third electrodes and the conductive beam, the conductive beam, after being attracted by and adhered to the second or third electrode, maintained to be adhered even when the electrostatic force is removed; and
    a controller determining an operation mode according to types of logic operations included in input data, setting an initial position of the conductive beam by applying the operating voltage to any one of the second and third electrodes according to the determined operation mode, selecting at least one of the first to third electrodes according to the determined operation mode, and applying a predetermined voltage as a true value of a logic value included in the input data.

2. The electromechanical logic-in-memory device as claimed in claim 1, wherein the input data includes any one of an AND operation, a NAND operation, a NOT operation, an XOR operation, and an XNOR operation.

3. The electromechanical logic-in-memory device as claimed in claim 2, wherein, when an AND operation of a first logic value and a second logic value is included in the input data, the controller sets an initial position of the conductive beam by applying the operating voltage to the second electrode, applies a voltage of $-\frac{1}{2}$ times the operating voltage as a true value of the first logic value to the first electrode, and applies a voltage of $\frac{1}{2}$ times the operating voltage as a true value of the second logic value to the third electrode.

4. The electromechanical logic-in-memory device as claimed in claim 2, wherein, when a NAND operation of a first logic value and a second logic value is included in the input data, the controller sets an initial position of the conductive beam by applying the operating voltage to the third electrode, applies a voltage of $-\frac{1}{2}$ times the operating voltage as a true value of the first logic value to the first electrode, and applies a voltage of $\frac{1}{2}$ times the operating voltage as a true value of the second logic value to the second electrode.

5. The electromechanical logic-in-memory device as claimed in claim 2, wherein, when a NOT operation of a first logic value is included in the input data, the controller sets an initial position of the conductive beam by applying the operating voltage to the third electrode, grounds the first electrode, and applies a voltage greater than or equal to the operating voltage as a true value of the first logic value to the second electrode.

6. The electromechanical logic-in-memory device as claimed in claim 2, wherein, when an XOR operation of a first logic value and a second logic value is included in the input data, the controller sets an initial position of the conductive beam by applying the operating voltage to the second electrode, applies a voltage greater than or equal to the operating voltage as a true value of the first logic value to the first electrode, and applies a voltage greater than or equal to the operating voltage as a true value of the second logic value to the third electrode.

7. The electromechanical logic-in-memory device as claimed in claim 1, wherein the controller maintains an unselected electrode among the first to third electrodes in a floating state.

8. The electromechanical logic-in-memory device as claimed in claim 1, wherein the conductive beam includes any one of a metal, carbon nanotube, graphene, and a conductive polymer.

9. The electromechanical logic-in-memory device as claimed in claim 1, wherein the first to third electrodes are formed of a same conductive material.

10. The electromechanical logic-in-memory device as claimed in claim 1, wherein the first electrode further includes a connection portion that is a region other than the conductive beam.

11. The electromechanical logic-in-memory device as claimed in claim 10, wherein the switching unit further includes:
a substrate; and
first to third insulating layers disposed on the substrate and supporting the first to third electrodes, respectively, wherein the first to third electrodes are disposed on a same plane, and the first insulating layer supports the connection portion.

12. The electromechanical logic-in-memory device as claimed in claim 10, wherein the switching unit further includes:
a substrate; and
a support portion disposed on the substrate and supporting the connection portion,
wherein the connection portion includes first and second connection portions, and
the first and second connection portions are disposed in centers of both sides of the conductive beam, respectively.

13. The electromechanical logic-in-memory device as claimed in claim 1, wherein the conductive beam is spaced apart from the second and third electrodes by a substantially same interval.

14. An electromechanical logic-in-memory device, comprising:
a first electrode having a conductive beam;
second and third electrodes disposed on both sides of the conductive beam and causing the conductive beam to be bent by electrostatic force, based on a potential difference applied between the second and third electrodes and the conductive beam; and
a controller determining an operation mode according to types of logic operations included in input data, setting an initial position of the conductive beam by applying the potential difference to any one of the second and third electrodes according to the determined operation mode, selecting at least one of the first to third electrodes according to the determined operation mode, and applying a predetermined voltage as a true value of a logic value included in the input data,
wherein, after the conductive beam is adhered to the second or third electrode, the conductive beam is maintained to be adhered even when the electrostatic force is removed.

15. The electromechanical logic-in-memory device as claimed in claim 14, wherein the input data includes a first logic value and a second logic value and any one of an AND operation, a NAND operation, an XOR operation, and an XNOR operation of the first logic value and the second logic value.

16. The electromechanical logic-in-memory device as claimed in claim 14, wherein the input data includes a first logic value and a NOT operation of the first logic value.

17. The electromechanical logic-in-memory device as claimed in claim 14, wherein the controller maintains an unselected electrode among the first to third electrodes in a floating state.

18. The electromechanical logic-in-memory device as claimed in claim 17, wherein the floating state is maintained by applying a floating voltage that is a voltage other than the predetermined voltage.

19. An electromechanical logic-in-memory device, comprising:
a first electrode including a connection portion and a conductive beam extending from the connection portion;
second and third electrodes disposed on both sides of the conductive beam and causing the conductive beam to be bent by electrostatic force, based on a potential difference applied between the second and third electrodes and the conductive beam; and
a controller determining an operation mode according to types of logic operations included in input data, setting an initial position of the conductive beam by applying the potential difference to any one of the second and third electrodes according to the determined operation mode, selecting at least one of the first to third electrodes according to the determined operation mode, and applying a predetermined voltage as a true value of a logic value included in the input data,
wherein the input data includes any one of an AND operation, a NAND operation, a NOT operation, an XOR operation, and an XNOR operation, and after the conductive beam is adhered to the second or third electrode, the conductive beam is maintained to be adhered even when the electrostatic force is removed.

20. The electromechanical logic-in-memory device as claimed in claim 19, further comprising:
a substrate on which the first to third electrodes are arranged; and
first to third insulating layers supporting the first to third electrodes, respectively, on the substrate,
wherein the first insulating layer supports the connection portion.

* * * * *